United States Patent [19]

Hunsinger et al.

[11] 3,979,702
[45] Sept. 7, 1976

[54] APPARATUS AND METHOD FOR OVERSAMPLED TRANSDUCERS IN ACOUSTIC SURFACE WAVE DEVICES

[75] Inventors: Bill J. Hunsinger, Mahomet; Jerry H. Peppler, Fort Wayne, both of Ind.

[73] Assignee: The Magnavox Company, Fort Wayne, Ind.

[22] Filed: Apr. 8, 1974

[21] Appl. No.: 458,940

[52] U.S. Cl. .................................. 333/72; 310/9.8
[51] Int. Cl.² ............................................. H03H 7/10
[58] Field of Search ............... 340/15; 333/30 R, 72; 310/9.7, 9.8

[56] References Cited
UNITED STATES PATENTS

| | | |
|---|---|---|
| 3,663,899 | 5/1972 | Dieulesaint et al. ................... 333/72 |
| 3,755,761 | 8/1973 | Hartmann ............................. 333/72 |
| 3,803,520 | 4/1974 | Bristol et al. ......................... 333/72 |
| 3,825,860 | 7/1974 | Carr ...................................... 333/72 |
| 3,845,419 | 10/1974 | Nudd ................................... 333/72 |
| 3,855,556 | 12/1974 | Hartmann ........................... 333/30 R |

Primary Examiner—Maynard R. Wilbur
Assistant Examiner—T. M. Blum
Attorney, Agent, or Firm—Joe E. Barbee; Thomas A. Briody; William J. Streeter

[57] ABSTRACT

Apparatus and method for providing electro-acoustic transducers of an acoustic surface wave device with an increased density of transducer elements. An increased density of transducer elements provides more accurate generation and reproduction of a desired frequency response above the design center frequency. By providing the sets of transducer elements which exchange signals by means of electro-acoustic surface waves with different densities of transducer elements, the transfer of undesired frequency components, introduced by the oversampled density of the transducer element sets, is reduced.

10 Claims, 3 Drawing Figures

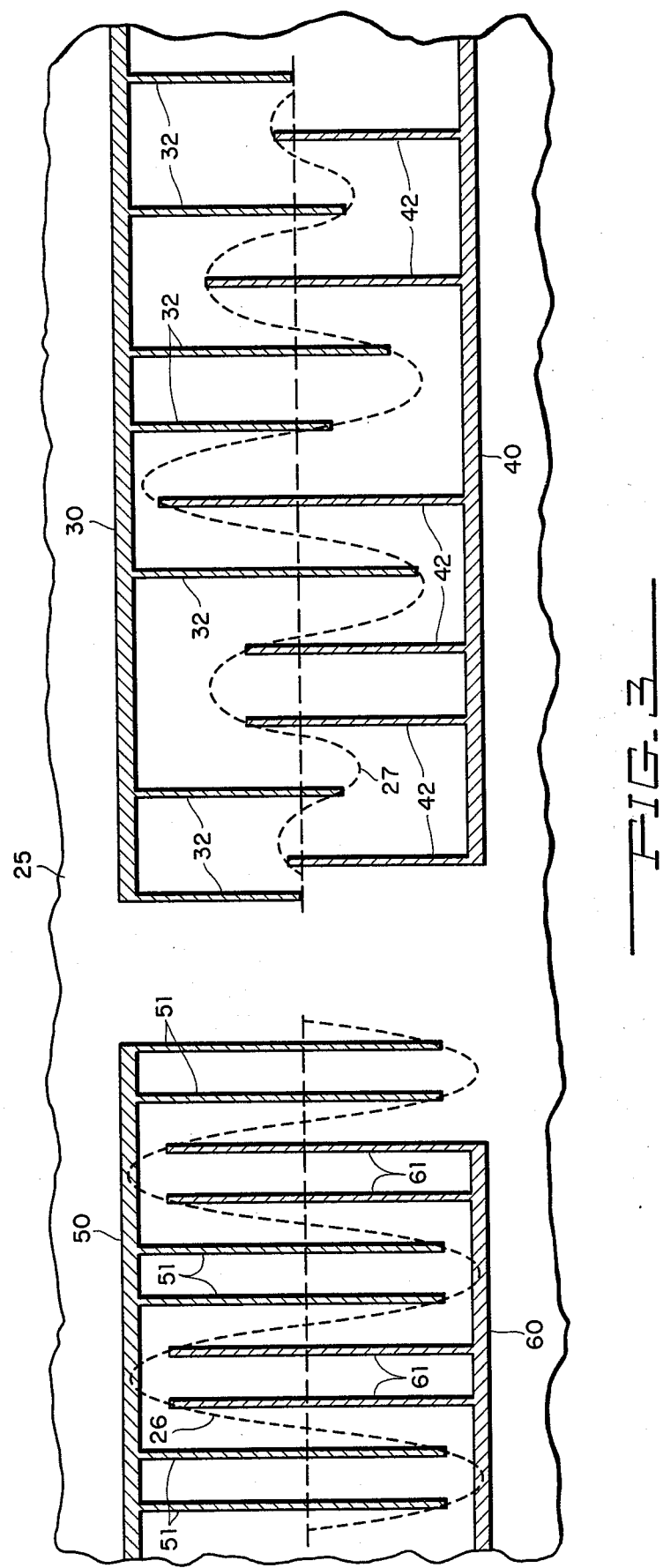

APPARATUS AND METHOD FOR OVERSAMPLED TRANSDUCERS IN ACOUSTIC SURFACE WAVE DEVICES

BACKGROUND OF THE INVENTION

1. Field of the Invention

This invention relates generally to acoustic surface wave devices and more particularly to apparatus for improving the frequency characteristics of acoustic surface wave devices. By providing a density of transducer electrode sets which is greater than the density determined by the design center frequency, more accurate exchange of frequencies above the design center frequency can be achieved between electrode sets.

2. Description of the Prior Art

In acoustic surface wave devices, surface waves are propagated between electro-acoustic transducers. The transducer configurations determine the transfer characteristics of the surface wave device. For example, a surface wave device can be arranged to act as a filter. In applications such as filter devices, the frequency response characteristics are typically specified. By associating the amplitude of overlap of transducer electrodes with local maxima and minima of this time domain representation, the desired frequency characteristics have been obtained in the prior art.

Where $f_c$ is the center frequency of the desired frequency response of the acoustic surface wave transducer, the local maxima or the local minima are typically separated by approximately $1/f_c$ in the time domain. Thus, electrodes are typically spaced in time (i.e. corresponding to surface wave traversal) $1/2f_c$ apart at positions corresponding to the local maxima and minima. However, as is well known, the highest frequency which can be accurately transmitted or received by such a sampling density is $f_c$. Thus, there is a deterioration of the frequency characteristics above the design center frequency in electro-acoustic transducers of the prior art.

Furthermore, it is clear that any attempt to provide improved frequency response must involve both the electrode set generating the acoustic surface waves and the electrode set detecting the presence of acoustic surface waves. The accuracy of the acoustic surface wave device frequency response is determined by the least accurate response of the two electrode sets.

It is therefore an object of the present invention to provide an improved electro-acoustic device.

It is a further object of the present invention to provide an improved electro-acoustic transducer.

It is another object of the present invention to provide a surface wave device with improved frequency fidelity above a design center frequency.

It is a still further object of the present invention to provide an electro-acoustic transducer with an increased density of electrodes.

It is yet a further object of the present invention to improve the frequency response of an acoustic surface wave device by increasing the sampling density of input and output transducers.

It is yet another object of the present invention to provide for reduction of spurious signal components resulting from the incorporation of increased electrode densities in an acoustic surface wave device.

These and other features of the present invention will be understood upon reading of the following description in conjunction with the drawings.

SUMMARY OF THE INVENTION

The aforementioned and other objects of the present invention are accomplished by providing electro-acoustic transducers with an electrode density above the sampling density determined by the design center frequency. The configuration of the electrodes in the increased or over-sampled electrode density transducer is determined by the envelope of time domain representation of the desired frequency response, but the electrodes will not in general fall at positions of local maxima and minima of the time domain representation of the desired frequency response.

To provide increase directionality of propagated acoustic waves, an input electro-acoustic transducer is typically not amplitude-encoded. An over-sampled input transducer wherein all electrodes are substantially the same length provides the best directionality for the generated waves.

Different sampling densities are employed for the input and the output transducers of the acoustic surface wave devices to minimize transfer of undesired frequency components resulting from utilization of oversampled transducer densities.

These and other features of the invention will be understood upon reading of the following description along with the drawings.

BRIEF DESCRIPTION OF THE DRAWINGS

FIG. 3 shows an electroacoustic device having oversampled transducers according to the preferred embodiment of the present invention.

DESCRIPTION OF THE PREFERRED EMBODIMENT

Description of the Apparatus

Figure 1:
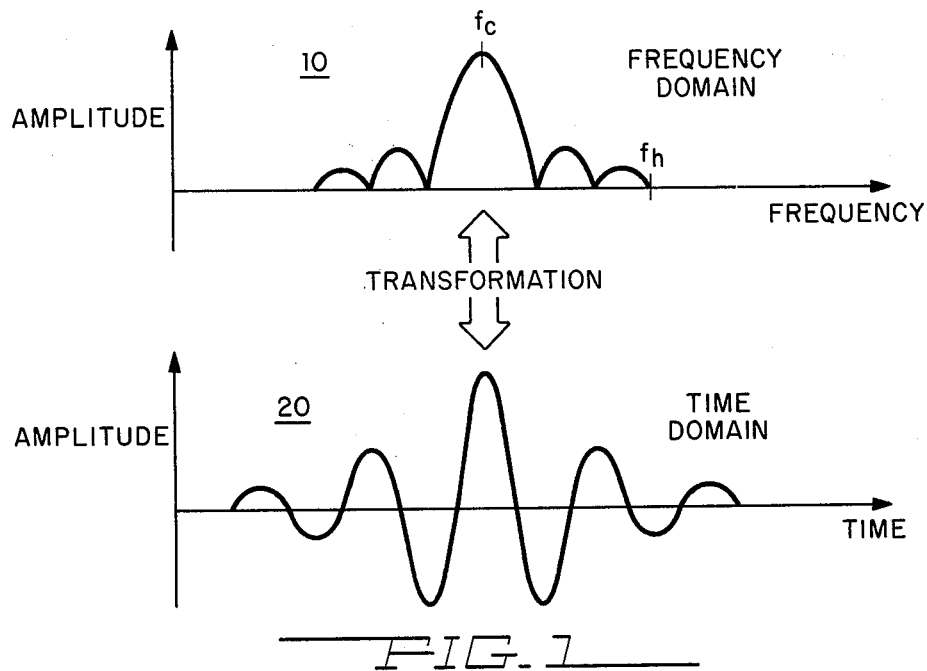
FIG. 1 shows a schematic representation of the transformation between the frequency domain and the time domain.

Referring now to FIG. 1, a schematic illustration of the transformation between response characteristics in the Frequency Domain 10 and response characteristics in the Time Domain 20 is shown. Typically response characteristics are specified in the Frequency Domain, for example, when the optimum response of a filter is selected. In this FIG., $f_c$ denotes the center frequency, while $f_h$ denotes the highest specified frequency. However, the response of an electro-acoustic filter with interleaved electrodes can be more conveniently described between a respresentation in the Frequency Domain and a representation in the Time Domain (e.g. by means of the Fourier analysis) are known to persons skilled in the art.

Figure 2:
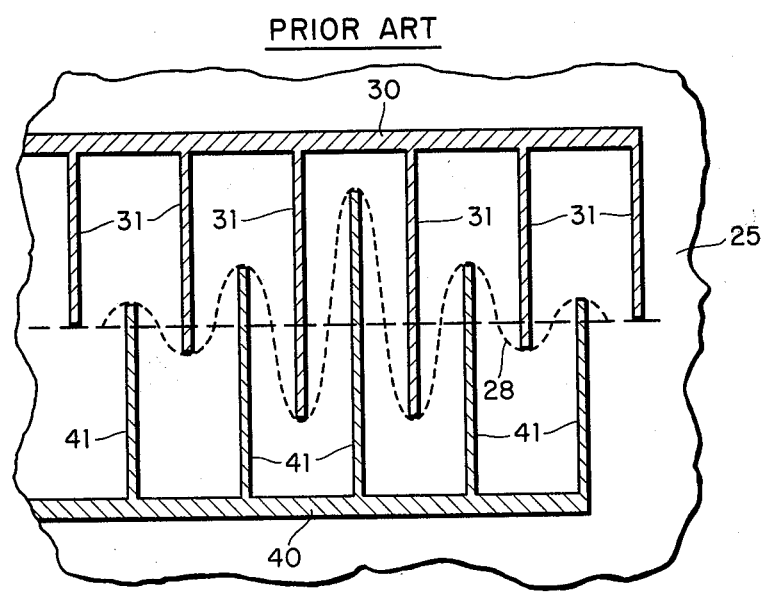
FIG. 2 shows the method of determining the configuration for overlap amplitude-encoded interleaved electrodes in prior art devices.

Referring next to the FIG. 2, the procedure, according to the prior art, for designing a transducer reproducing the desired Time Domain response is shown. The Time Domain function can be transferred to a transducer associated with an Acoustic Wave Propagating Medium 25 by recognizing that the time axis, when multiplied by the velocity of wave propagation in Medium 25, $v_o$, becomes a distance axis for determining relative positions between transducers. One set of Electrodes 31 is located at the positions determined by the local minima of the Time Domain function while a second set of Electrodes 41 is located at positions determined by the local maxima of the Time Domain functions. Electrodes 31 are coupled to Conductor 30 which can be arbitrarily assigned a negative polarity, while the Electrodes 41 are coupled to Conductor 40 which can arbitrarily be assigned a positive polarity. The amplitude of the overlap between the interleaved Electrodes 31 and Electrodes 41 is determined by the relative heights of the local extrema of the Time Domain representation. This determination is illustrated by the Time Domain function indicated by the dotted line. The amplitude of the overlap of two interleaved electrodes results in the proportionate amplitude for a generated acoustic wave, or a signal resulting from the detection of an acoustic surface wave, by the two electrodes.

Referring next to FIG. 3, two transducers, having over-sampled electrode densities according to the present invention, are shown. The two transducers are coupled to Acousitc Wave Propagating Medium 25. A first transducer is comprised of Electrodes 51 coupled to Conductor 50 and Electrodes 61 coupled to Conductor 60. The first transducer is typically employed as an input transducer. The dotted Curve 26 indicates the center frequency of acoustic waves to be propagated from the first transducer to the second transducer. The seperation between adjacent Electrodes is substantially constant and is equivalent to a phase of 90° for the center frequency. The overlap amplitude transducer electrodes is substantially constant to minimize a spreading of the generated acoustic waves.

The second transducer is positioned on Medium 25 to intercept acoustic waves launched from an input transducer. The second transducer includes Electrodes 32 coupled to Conductor 30 and Electrodes 42 coupled to Conductor 40. The Time Domain function, which represents the desired device response, is shown superimposed on the second transducer as dotted Curve 27. The amplitudes of the Electrodes are determined by the envelope of the curve. Adjacent Electrodes are not, in general, coupled to different Conductors. Similarly, the Electrodes are not, in general, positioned at the extrema as indicated by the Time Domain function 27. In the preferred embodiment, the Electrodes are generally placed on equal distance apart. The maximum distance between adjacent Electrodes can determine a limit to the frequency response of the transducers.

Operation of the Preferred Embodiment

The first (or input) transducer electrode sampling density is chosen so that there is a higher sampling density than can be employed without compromising the directionality of the generated acoustic waves. It is known to those skilled in the art that for uniformly spaced receiver electrodes, distortion of frequency characteristics above roughly one-half the sampling frequency rate are introduced. However, by choosing the electrode positions symmetrically along the envelope determined by the Time Domain function, the Electrodes (i.e. 51 and 61 of FIG. 3) have substantially the same length. This uniformity of length results in greater directionality for the generated acoustic wave. The sampling density of this electrode configuration is $4f_c$. Error components will be generated by this configuration, but the error components will not be received by a properly selected over-sampled second (or output) transducer.

The second transducer also has oversampled electrode density. Because of the higher sampling frequency, the detection of all the desired frequencies to $f_h$ (c.f. the Frequency Domain function of FIG. 1) can be achieved. Acoustic wave error components generated by the input transducer with a sampling density of $4f_c$ will typically be at frequency in the region of $2f_c$, which is normally greater than $f_h$. Thus, in the preferred embodiment, frequency up to and including $f_h$ can be more accurately detected, while the error component, introduced by the input transducer, will not be detected. It is found that electrode densities above $2f_c/0.7$ provide the best results for the transducer detecting the acoustical surface waves; however, other sampling electrode densities can offer improvement as will be clear to those skilled in the art. It is found that electrode densities above $4f_c$, which can result in three electrodes being associated with a local maxima or minima in a Time Domain representation, introduces distortion in the fidelity of signal detection. Therefore, the electrode sampling density of $4f_c$ of the input transducer provides an upper limit to the electrode sampling density.

It will further be clear to those skilled in the art that the design center frequency of the input transducer need not be identical with the design center frequency of the output transducer. Nonetheless, the density of the output transducer electrodes is limited by the sampling electrode density of the input transducer.

The electrode spacing need not be uniform as is shown in FIG. 3. However, it will be apparent that deviations from a uniform electrode density cause distortions which are a function of the largest interelectrode transducer spacing.

The above description is included to illustrate the operation of the preferred embodiment and is not meant to limit the scope of the invention. The scope of the invention is to be limited only by the following claims. From the above discussion, may variations will be apparent to one skilled in the art that will yet be encompassed by the spirit and scope of the invention.

What is claimed is:

1. A electro-acoustic device for producing a predetermined frequency response comprising:
   an acoustic-wave propagating medium;
   a first electro-acoustic transducer coupled to said medium, said first transducer including at least a pair of overlapping sampling electrode sets, said first transducer having an average sampling frequency by said first transducer electrodes which is greater than two times a design center frequency of said predetermined frequency response; and
   a second electro-acoustic transducer coupled to said medium, said second transducer including at least a pair of overlapping electrode sets, said second transducer having an average sampling frequency by said second transducer electrodes which is greater than two times said design center frequency, and different from the average sampling frequency of said first electro-acoustic transducer.

2. The electro-acoustic device of claim 1 wherein said first transducer sampling frequency is approximately four times said design center frequency, said second transducer electrode sampling frequency is less than four times said design center frequency.

3. The electro-acoustic device of claim 2 wherein, in said first transducer, a value of overlap of each electrode from a first of a pair of electrode sets from the first transducer with an adjacent electrode from a second of said pair of electrode sets is generally a constant.

4. An electro-acoustic transducer for providing a predetermined frequency response, comprising:
an acoustic wave propagating medium;
a first set of electrodes coupled to said medium, wherein electrodes of said first set are electrically coupled together; and
a second set of electrodes coupled to said medium, wherein electrodes of said second set are electrically coupled together, said first set of electrodes extending between and overlapping said second set of electrodes, the electrodes having a density wherein a frequency of sampling a wave associated with said medium is between twice a design center frequency and four times said design center frequency.

5. The electro-acoustic transducer of claim 4 wherein said predetermined frequency response is associated with a time domain representation dependent on said medium and wherein electrode structure of said first and said second set is determined by an envelope of said time domain representation.

6. An electro-acoustic device for producing a predetermined frequency response, comprising:
an acoustic-wave propagating medium;
a first transducer coupled to said medium including a first set of electrically-coupled electrodes, and a second set of electrically-coupled electrodes, wherein said first and said second set of electrodes are comprised of groups of electrodes, said groups of electrodes formed generally of fewer than three adjacent electrodes, groups of electrodes of said first set interleaved with groups of electrodes of said second set; and
a second transducer coupled to said medium including a third set of electrically-coupled electrodes, and a fourth set of electrically-coupled electrodes, wherein said third and said fourth sets of electrodes are comprised of groups of adjacent electrodes, said groups of adjacent electrodes formed generally of fewer than three adjacent electrodes, groups of electrodes of said third electrode set interleaved with groups of electrodes of said fourth electrode set, wherein an average density of electrodes of said second transducer is less than the average density of electrodes of said first transducer, and said first transducer average electrodes density provides an average sampling frequency approximately four times a design center frequency for said frequency response.

7. A method of providing an electro-acoustic device with a predermined frequency response, comprising the steps of:
generating acoustic waves with an input electro-acoustic transducer having a first density of electrodes for providing oversampling of said acoustic waves;
locating an output transducer to interact with said acoustic waves generated by said input transducer, said output transducer having a second density of electrodes for oversampling of said acoustic waves; and
providing said input transducer with electrodes having a substantially constant overlap for electrodes associated with a first polarity and adjacent electrodes associated with a second polarity thereby providing an accurate generation and reproduction of the predetermined frequency response.

8. A method of providing an electro-acoustic device with a predetermined frequency response of Claim 7, further including the steps of:
positioning electrodes associated with said input transducer to provide an average transducer oversampling frequency substantially four times a design center frequency; and
positioning electrodes associated with said output transducer to provide an average oversampling frequency less than four times said design center frequency.

9. An electro-acoustic transducer intersecting with acoustic wave propagating in a suitable medium, comprising:
a first set of electrodes coupled to said medium, wherein electrodes of said first set are electrically coupled, said electrodes of said first set being divided in a first plurality of electrode groups, at least one of said groups including two adjacent electrodes;
a second set of electrodes coupled to said medium, wherein electrodes of said second set are electrically coupled, said electrodes of said second set being divided into a second plurality of electrode groups, at least one of said second plurality of groups containing two adjacent electrodes, and wherein said second plurality of electrodes is interleaved with said first plurality of electrodes; and
said second set of electrodes having preselected frequency characteristics including a design center frequency, a design maximum frequency, an average density of electrodes of said transducer selected to produce sampling frequency of an acoustic wave propagating in said medium greater than two times said design maximum frequency and less than four times said design center frequency.

10. A method of providing an electro-acoustic transducer with a predetermined frequency response, said transducer being coupled to a suitable medium comprising the steps of:
determining an average density of electrodes to produce a sampling frequency between two times a design center frequency of said predetermined frequency response and four times said design center frequency;
coupling electrodes having said average density on said medium, extrema of electrodes determined by a time domain representation of said predetermined frequency;
electrically coupling electrodes associated with local minima of said time domain representation; and
electrically coupling electrodes associated with local maxima of said time domain.

* * * * *